United States Patent
Noguchi et al.

(10) Patent No.: US 6,891,402 B2
(45) Date of Patent: May 10, 2005

(54) CLOCK'S OUT-OF-SYNCHRONISM STATE DETECTION CIRCUIT AND OPTICAL RECEIVING DEVICE USING THE SAME

(75) Inventors: Hidemi Noguchi, Tokyo (JP); Tetuo Tateyama, Tokyo (JP); Madoka Kimura, Miyagi (JP)

(73) Assignee: NEC Corporation, Tokyo (JP)

(*) Notice: Subject to any disclaimer, the term of this patent is extended or adjusted under 35 U.S.C. 154(b) by 65 days.

(21) Appl. No.: 10/300,526

(22) Filed: Nov. 21, 2002

(65) Prior Publication Data

US 2003/0094974 A1 May 22, 2003

(30) Foreign Application Priority Data

Nov. 21, 2001 (JP) .................................. 2001-355446

(51) Int. Cl.⁷ ............................................ H03D 13/00
(52) U.S. Cl. ................................... 327/41; 327/48
(58) Field of Search ............... 327/12, 18–20, 327/37, 40–43, 47–49, 151, 160, 176, 279, 286

(56) References Cited

U.S. PATENT DOCUMENTS

| | | | | |
|---|---|---|---|---|
| 3,781,695 A | * | 12/1973 | Jackson | 327/159 |
| 5,142,556 A | * | 8/1992 | Ito | 375/354 |
| 6,326,823 B1 | * | 12/2001 | Okui | 327/160 |
| 6,346,837 B1 | * | 2/2002 | Shibayama | 327/156 |
| 6,400,197 B2 | * | 6/2002 | Lai et al. | 327/161 |

FOREIGN PATENT DOCUMENTS

| | | |
|---|---|---|
| JP | 60-98727 | 6/1985 |
| JP | 63-87039 | 4/1988 |
| JP | 64-19827 | 1/1989 |
| JP | 3-18142 | 1/1991 |
| JP | 9-116427 | 5/1997 |
| JP | 2000-0278124 | 10/2000 |
| JP | 2002-124937 | 4/2002 |
| JP | 2002-135093 | 5/2002 |

* cited by examiner

*Primary Examiner*—My-Trang Nuton
(74) *Attorney, Agent, or Firm*—Young & Thompson

(57) ABSTRACT

A detection circuit which can reliably detect an out-of-synchronism state of a clock signal with respect to data even if jitter is present in a data signal. A delayed clock signal obtained by delaying a clock signal by 90° through a delay circuit is input to a data input (D) of a flip flop, and the clock signal is read in at the point of change of the data. A logic product of the inverted output of the flip flop and the data signal is obtained by an AND circuit. Then, a logic product output is counted by a counter circuit, and an out-of-synchronism state of the clock with respect to the data is detected based on the output of the counter circuit.

16 Claims, 8 Drawing Sheets

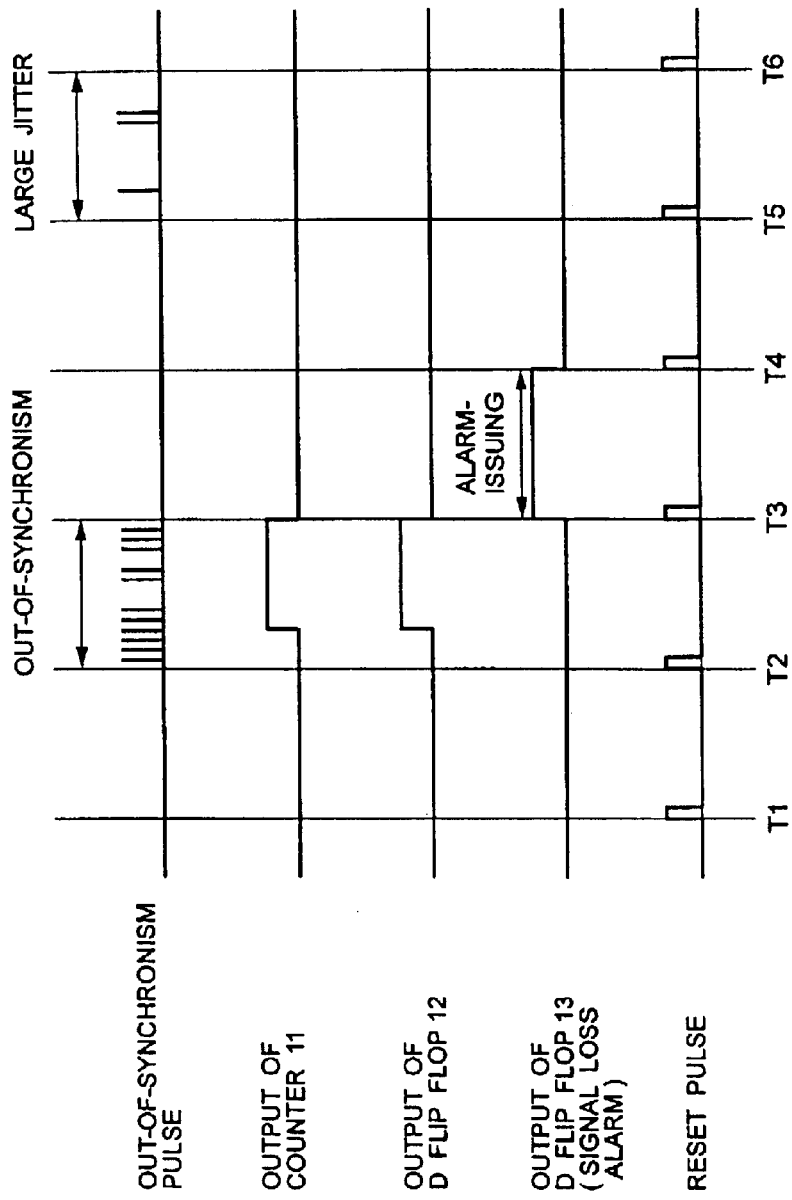

US 6,891,402 B2

CLOCK'S OUT-OF-SYNCHRONISM STATE DETECTION CIRCUIT AND OPTICAL RECEIVING DEVICE USING THE SAME

BACKGROUND OF THE INVENTION

1. Field of the Invention

The present invention relates to a clock's out-of-synchronism state detection circuit and an optical receiving device using the circuit, and in particular, to a clock's out-of-synchronism state detection circuit for detecting an out-of-synchronism state of a clock signal with respect to a data signal in an optical receiving device, and an optical receiving device using the circuit.

2. Description of the Prior Art

At the time of occurrence of loss of a data signal to an optical receiving device and degradation in S/N thereof, the issuing of an alarm is an essential function to maintain the quality of a transmission line. As one of general methods of detecting the loss of a data signal and the S/N degradation, there is a method of using a frequency control voltage for a voltage-controlled oscillator used in a PLL (Phase Locked Loop) circuit, which performs clock regeneration. That is, at the time of occurrence of data loss and S/N degradation, the PLL circuit is greatly out of the locked state, and thus the frequency control voltage for the voltage-controlled oscillator therein greatly deviates from that when the PLL circuit is in a locked state. Thus, when this deviation of the frequency control voltage reaches to a predetermined value, the method can issue an alarm.

When S/N of a data signal to an optical receiving device is degraded, jitter in the data signal (frequency varies every one bit in the proximity of the inherent frequency of the data signal) increases and the signal approaches random noise. Then, the frequency control voltage greatly varies such that the voltage controlled oscillator of the PLL circuit may be pulled into its locked state.

On the other hand, even in the case in which predetermined quality of a transmission line is kept, jitter is actually included in the data signal more or less. In this case, the frequency control voltage also varies to pull the voltage-controlled oscillator of the PLL circuit into its locked state. Therefore, according to a method of using the frequency control voltage for the voltage-controlled oscillator in a conventional manner, it is difficult to set a threshold value for determining whether the operation is in a normal condition or in an alarm condition, and thus it becomes impossible to issue an alarm at the time of S/N degradation and loss of the data signal.

BRIEF SUMMARY OF THE INVENTION

An object of the present invention is to provide a clock's out-of-synchronism state detection circuit allowing reliable detection of an out-of-synchronism state of a clock signal with respect to a data signal even if jitter is present in the data signal.

The present invention provides a clock's out-of-synchronism state detection circuit which comprises reading-in means for reading a clock signal in at the point of change of a data signal, logic computing means for performing the logic computing of the read-in result obtained by the reading-in means and the above described data signal, and counter means for counting the logic-computing output, and which is characterized in that an out-of-synchronism state of the above described clock with respect to the above described data is detected based on the count result of the counter means.

Also, the present invention provides a clock's out-of-synchronism state detection circuit which comprises reading-in means for reading a clock signal in at the point of change of a data signal, and counter means for counting the read-in result obtained by the reading-in means, and which is characterized in that an out-of-synchronism state of the above described clock with respect to the above described data is detected based on the count result of the counter means.

Further, the present invention provides an optical receiving device characterized by comprising these clock's out-of-synchronism state detection circuits.

The operation of the present invention will be described. A delayed clock signal obtained by delaying a clock signal by 90° through a delay circuit is input to a data input (D) of a flip flop, and thus the clock signal is read in at the point of change of data. The logic product of the inverted output of the flip flop and the data signal is obtained by an AND circuit. Then, the logic product output is counted by a counter circuit, and an out-of-synchronism state of the clock signal with respect to the data is detected based on the output of the counter circuit. That is, the configuration is made such that a clock signal in synchronism with a data signal may be delayed by 90° to be read in at the point of change (rising edge or trailing edge) of the data signal, and thus a pulse (out-of-synchronism pulse) obtained in the logic product of the read-in result and the data signal, or the rising edge of the pulse may be counted, and when the count value is equal to or more than a predetermined value, a clock's out-of-synchronism state detection alarm may be issued. Thereby, an out-of-synchronism state of the clock can be reliably detected.

BRIEF DESCRIPTION OF THE DRAWINGS

FIG. 6 is a timing chart for showing an operation of the counter circuit of FIG. 5;

DETAILED DESCRIPTION OF THE PREFERRED EMBODIMENTS

Figure 1:
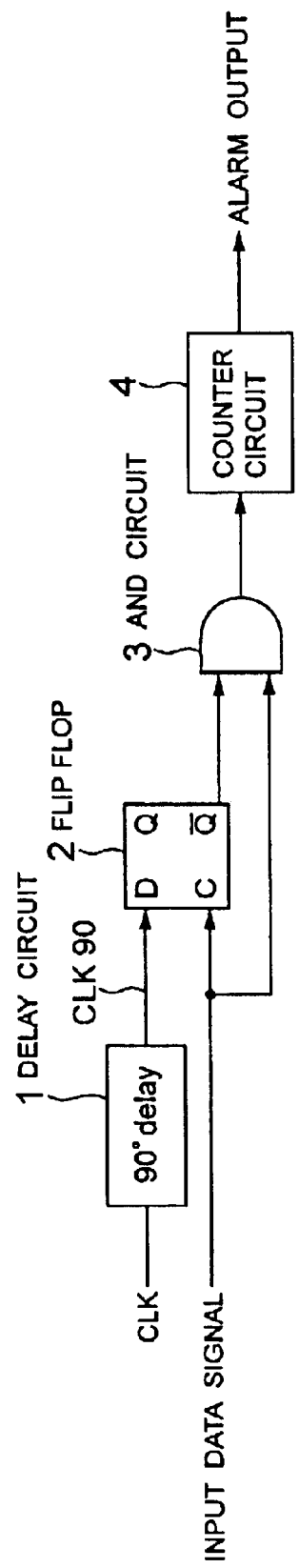
FIG. 1 is a diagram for showing a configuration according to one embodiment of the present invention.

Hereinafter, an embodiment of the invention will be described with referring to drawings. FIG. 1 is a circuit diagram for showing an embodiment of the present invention. In FIG. 1, the present embodiment comprises a delay circuit 1 for delaying a clock signal (CLK) in synchronization with an input data signal by 90°, a D flip flop 2 receiving an output of the delay circuit 1 as input to a data input (D) thereof and the data signal as input to a clock input (C) thereof, an AND circuit 3 computing a logic product of an inverted output of the D flip flop 2 and the data signal, and a counter circuit 4 counting output pulses from the AND circuit 3 and issuing a clock's out-of-synchronism state detection alarm when the number of the counted pulses becomes equal to or more than a predetermined value.

Figure 2:
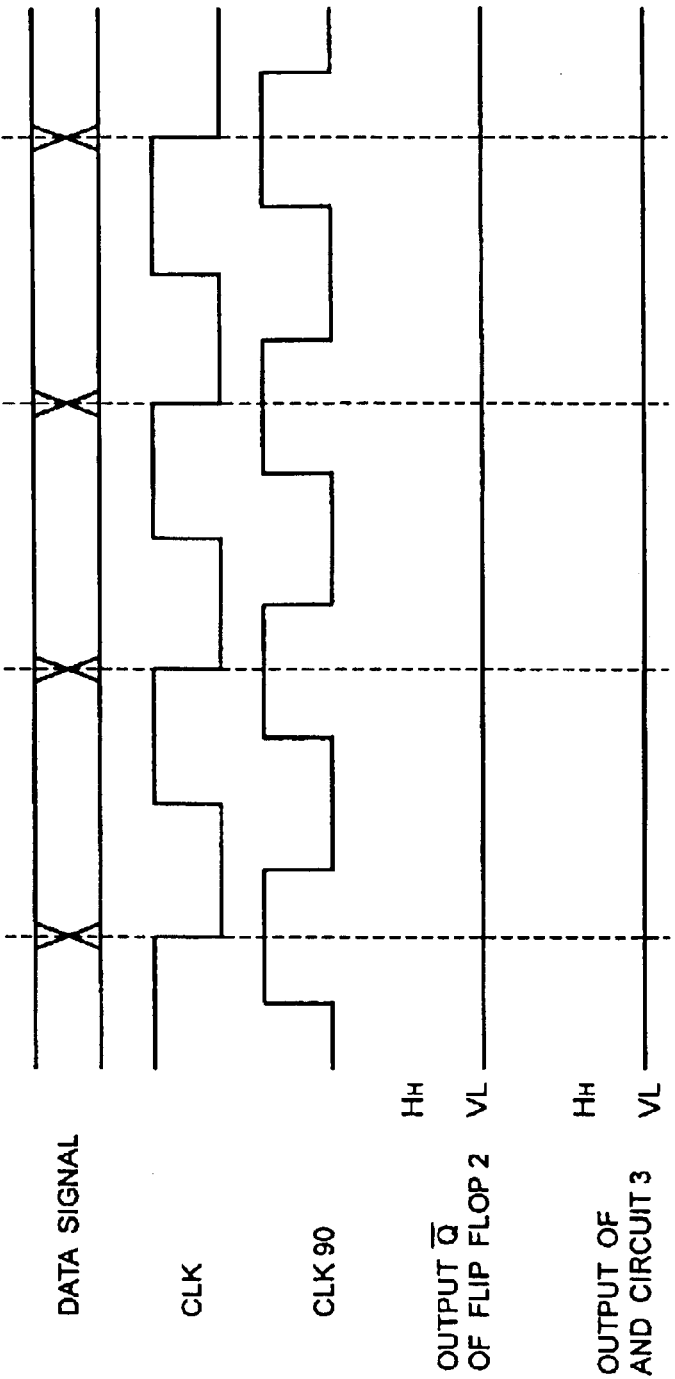
FIG. 2 is a timing chart for showing an operation of a circuit of FIG. 1 when the circuit is normal.

The operation of the circuit of the embodiment shown in FIG. 1 will be described by using FIG. 2 to FIG. 4. FIG. 2 shows examples of operating waveforms during normal operation, that is, during frequency synchronization. A clock signal referred to as CLK 90 is obtained by delaying by 90° the clock signal (CLK) in synchronization with the data signal through the delay circuit 1. Further, it is not necessary that the delay circuit 1 accurately delays the clock signal by 90°, and a delay circuit delaying it by about 90° may be enough to be used. This reason is that, because the flip flop 2 reads the clock signal in at the point of change of the data signal, what is required is only to satisfy such a phase relation that, during normal operation, the points of change of the data signal are positioned at the midpoint of the high level of the clock pulse.

During frequency synchronization, the falling edges of CLK always coincide with the cross points of the data signals. At this time, because the flip flop 2 always reads the high level of CLK 90 in, the inverted output of the flip flop 2 always goes to a low level VL. Therefore, the output of the AND circuit 3 is always at the low level VL. At this time, the counter circuit 4 has no input of pulses to count, and thus does not issue any clock's out-of-synchronism state detection alarm.

Figure 3:
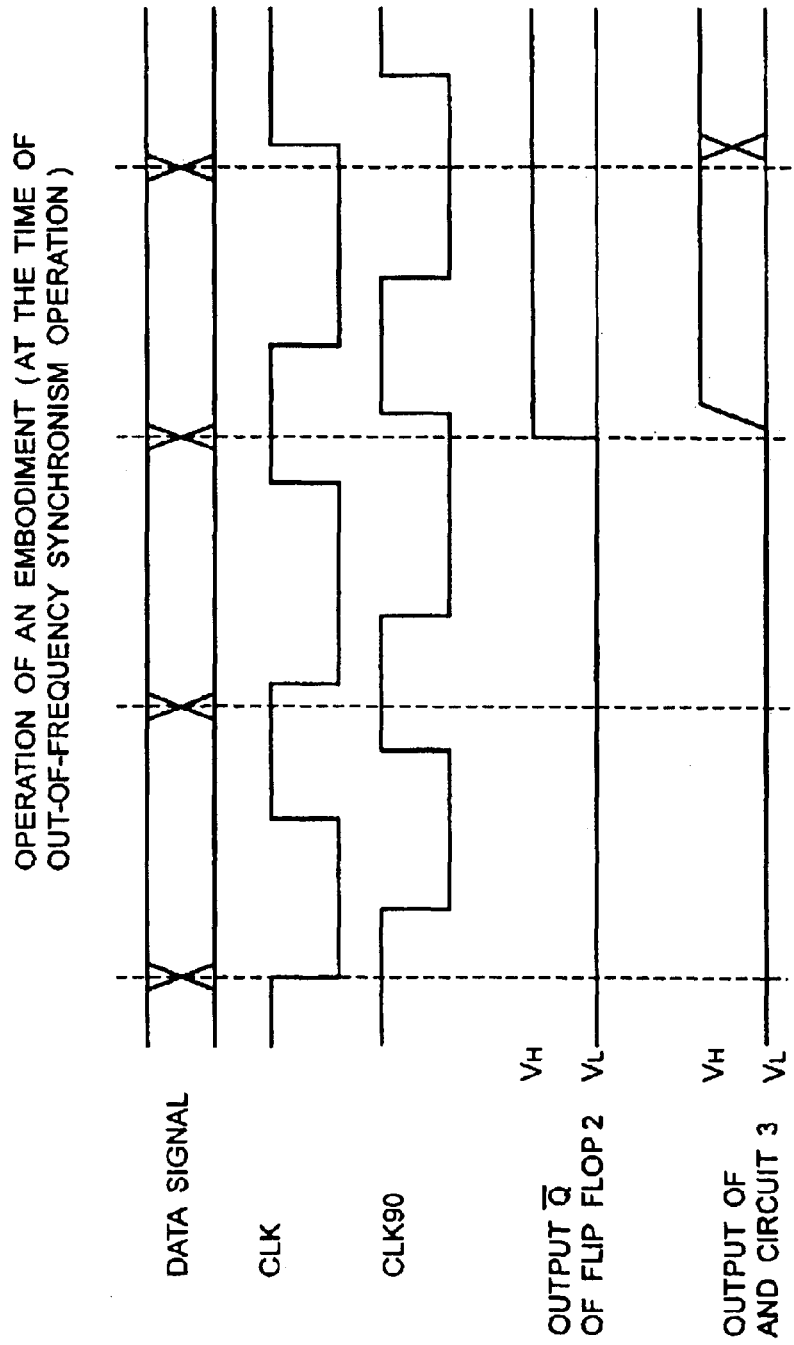
FIG. 3 is a timing chart for showing an operation of the circuit of FIG. 1 when the circuit is out of synchronism in frequency.

FIG. 3 is a diagram for showing examples of operating waveforms which are out-of-synchronism in frequency. When the data signal and clock signal are not synchronized with each other, the frequencies of the data signal and CLK are deviated from one another, and as a result, the position of CLK 90 at which the flip flop 2 reads CLK 90 in is shifted every time. That is, while the flip flop 2 reads the high levels of CLK 90 in, its inverted output is at VL, and while the flip flop 2 reads the low levels of CLK 90 in, its inverted output is at VH. Therefore, only while the output of the flip flop 2 is at VH, the data signal is output to the output of the AND circuit 3.

Figure 4:
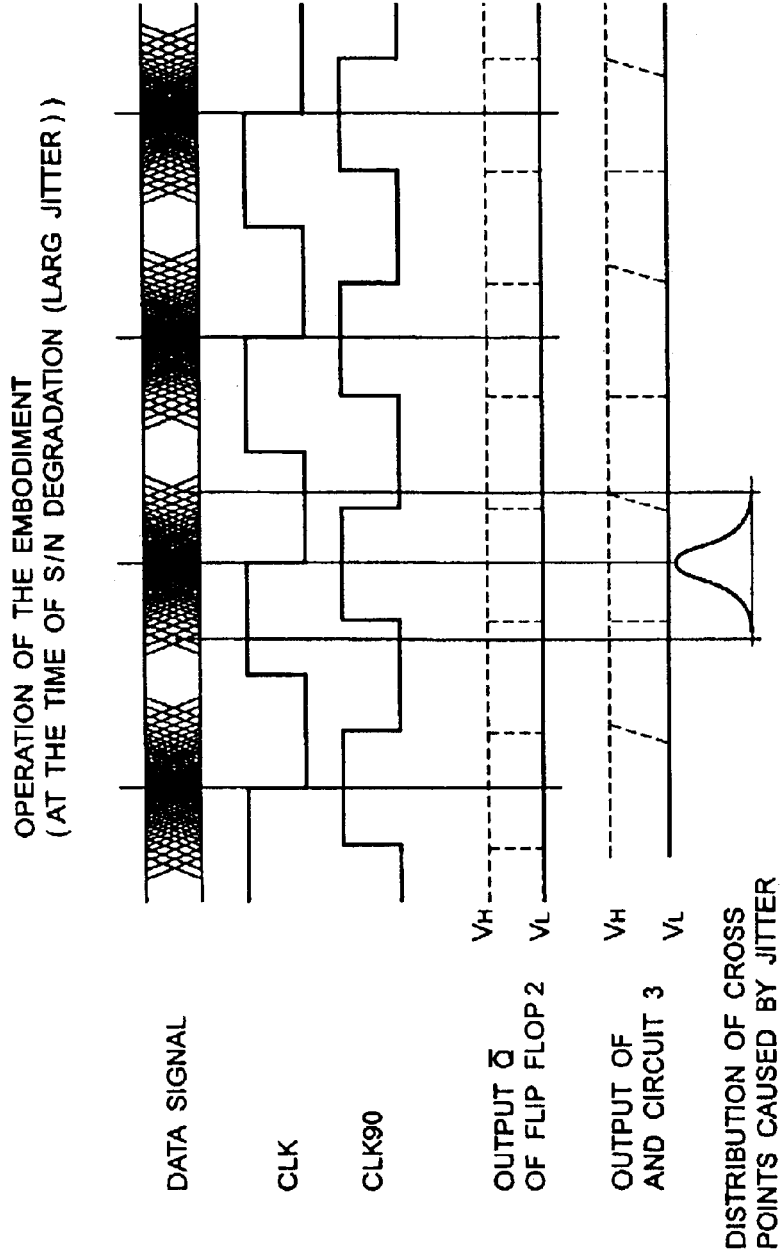
FIG. 4 is a timing chart for showing an operation of the circuit of FIG. 1 when the circuit is degraded in S/N.

FIG. 4 is a diagram for showing examples of operating waveforms when the data signal is degraded in S/N. S/N degradation of the data signal appears as increased jitter at the cross points of the data signal. In this case, resultantly, the flip flop 2 reads the low level VL of CLK 90 in with a probability depending on the distribution of the cross point positions in the time axis direction, though in synchronization with the data signal. For this reason, only while the output of the flip flop 2 is at VH, and with a probability depending on the distribution of the cross point positions in the time axis direction, the data signal is output to the output of the AND circuit 3.

In the present embodiment, during frequency synchronization, the falling edges of CLK coincide with the cross points of the data signal, but the rising edges of CLK may coincide with the cross points of the data signal.

Figure 5:
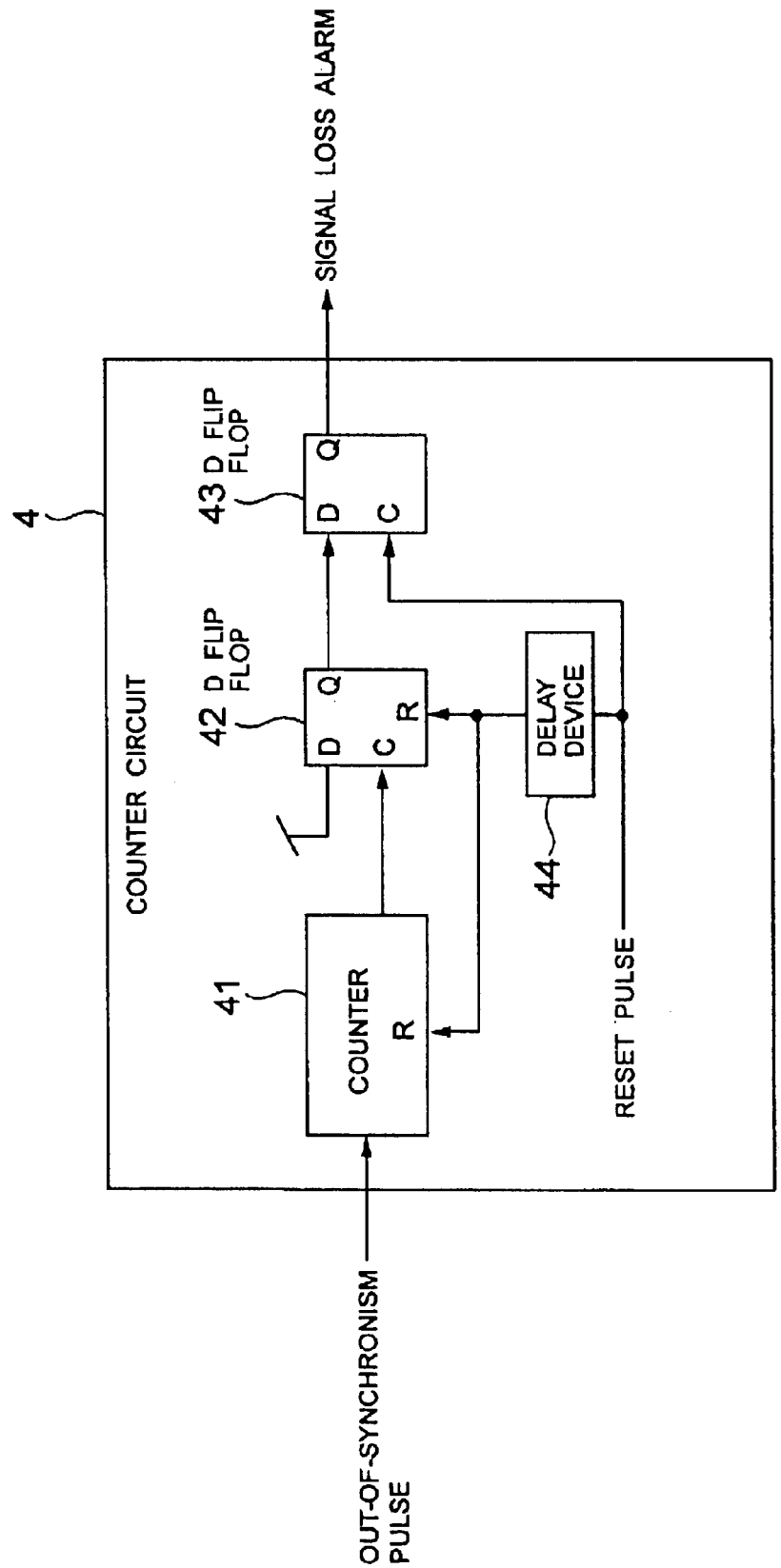
FIG. 5 is a diagram for showing an example of a counter circuit 4 in the circuit of FIG. 1.

FIG. 5 shows an example of a concrete configuration of the counter circuit 4 shown in FIG. 1. It is assumed that a counter 41 counts the number of out-of-synchronism pulses or the rising edges of the out-of-synchronism pulses within a predetermined time, and when the number of the out-of-synchronism pulses or the rising edges of the out-of-synchronism pulses becomes equal to or more than a predetermined number, the counter 41 outputs "1".

A D flip flop 42 reads "1" at the data terminal D in every time an output of "1" is output from the counter 41, and outputs "1" to the data terminal D of D flip flop 43. A D flip flop 43 reads the output of the D flip flop 42 in and outputs it every time it receives a reset pulse. When the number of the out-of-synchronism pulses or the rising edges of the out-of-synchronism pulses is equal to or more than a given value, the output of the D flip flop 42 becomes "1", and outputs "1" as an alarm.

A delay element 44 is inserted to ensure an order relation that the counter 41 and the D flip flop 42 are reset directly after the D flip flop 43 has read the output of the D flip flop 42 in. By the way, if the order relation between the read-in and the reset is reliably performed from the viewpoint of the circuit design, the delay element 44 may be particularly eliminated.

Figure 7A:
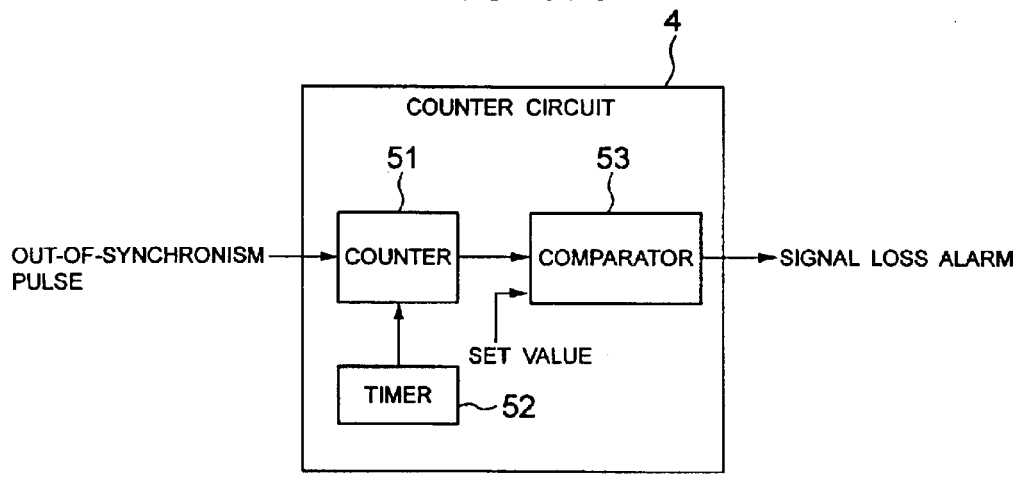
FIG. 7A is a diagram for showing another example of the counter circuit 4 in the circuit of FIG. 1.
Figure 7B:
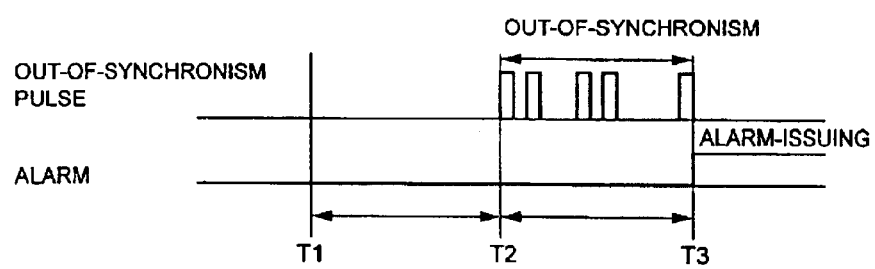
FIG. 7B is a timing chart for showing its operation.

With reference to FIG. 6, FIG. 7A, and FIG. 7B, the operation of the counter circuit 4 shown in FIG. 5 will be described. An out-of-synchronism pulse or the rising edge of the out-of-synchronism pulse from the AND circuit 3 is input to the counter 41 in the counter circuit 4. The counter 41 counts the number of the out-of-synchronism pulses or the rising edges of the out-of-synchronism pulses within a predetermined fixed time, and when the number of the out-of-synchronism pulses or the rising edges of the out-of-synchronism pulses is equal to or more than a predetermined number, the counter 41 outputs "1". This predetermined fixed time is naturally larger than the period of the data signal.

At the time T2 of FIG. 6, the counter 41 is reset by a reset pulse and starts the counting of the number of out-of-synchronism pulses or the rising edges of the out-of-synchronism pulses. When the number reaches to a predetermined number, the counter 41 outputs "1". The D flip flop 42 reads "1" of its data terminal D in at the rising edges of the data output of "1" from the counter 41, and outputs the value "1", and holds "1" until a next reset pulse comes. That is, when the number of the out-of-synchronism pulses or the rising edges of the out-of-synchronism pulses within a predetermined time (in the present embodiment, the interval between reset pulses) is equal to or more than a predetermined number, the output of the D flip flop 42 goes to "1".

The D flip flop 43 reads the output of the D flip flop 42 in at the period of the reset pulses, and if the output of the D flip flop 42 is "1" at this time, the D flip flop 43 issues an alarm.

The issuing/releasing of an alarm will be described in detail with reference to FIG. 6. At a time T1, the output of the counter 41 is reset by a reset pulse, and at the same time, the counter 41 starts the counting of out-of-synchronism pulses or the rising edges of the out-of-synchronism pulses. However, because no out-of-synchronism pulse or no rising edge of the out-of-synchronism pulse is present between the time T1 and a time T2, the output of the counter 41 and the output of D flip flop 42 remain "0" for this period. At the time T2, the D flip flop 43 reads the output "0" of the D flip flop 42 in, thus not issuing an alarm.

At the time T2, the output of the counter 41 is reset by a reset pulse, and at the same time, the counter 41 starts the counting of out-of-synchronism pulses or the rising edges of the out-of-synchronism pulses. When the number of the counted pulses reaches to a predetermined value, the counter 41 outputs "1". The D flip flop 42 reads "1" at its data terminal in at the point of change when the output of the counter 41 changes from "0" to "1", and hold an output "1" until the reset pulse of a time T3 comes. At the time T3, the D flip flop 43 reads the output "1" of the D flip flop 42 in directly before the time T3, and then the output of the D flip flop 43 goes to "1", thus issuing an alarm.

Between the time T3 and the time T4, no out-of-synchronism pulse or no rising edge of the out-of-synchronism pulse is present, and therefore the output of the counter 41 and the output of the D flip flop 42 both become "0". At the time T4, the D flip flop 43 reads the output "0" of the D flip flop 42 in and outputs "0", thus releasing the alarm.

Between the time T5 and the time T6, a small number of out-of-synchronism pulses or the rising edges of the out-of-synchronism pulses are present. However, because the number does not reach to a predetermined number, the output of the counter 41 and the output of the D flip flop 42 remain "0". Thus, at the time T6, the D flip flop 43 still read the output "0" of the D flip flop 42 in, not issuing an alarm. This state is attributable to out-of-synchronism pulses or the rising edges of the out-of-synchronism pulses caused by the fact that positions of cross points are distributed with a certain probability in the time axis direction due to jitter in the data signal. Thus, this state is not a true out-of-synchronism state, and therefore it should not issue an alarm.

FIG. 7A is a diagram for showing another configuration of the counter 4 according to the embodiment of FIG. 1. A counter 51 counts the number of out-of-synchronism pulses or the number of the rising edges of the out-of-synchronism pulses from the AND circuit 3 for a fixed time defined by a timer 52. The counter 51 is reset after the elapse of the fixed time, and then restarts the counting for a fixed time defined by the timer 52.

The timer 52 gives the counting time of the counter 51, and resets the counter 51 after the elapse of the set time. If the number of the out-of-synchronism pulses or the rising edges of the out-of-synchronism pulses counted by the counter 51 is equal to or more than a predetermined number, a comparator 53 issues an alarm.

With reference to FIG. 7B, the operation of the counter 4 will be described. Out-of-synchronism pulses or the rising edges of the out-of-synchronism pulses from the AND circuit 3 are input to the counter circuit 4. The counter 51 of the counter circuit 4 starts, at the time T1, the counting of the number of the out-of-synchronism pulses or the rising edges of the out-of-synchronism pulses, and ends the counting at the time T2, then outputting the count result to the comparator 43.

The comparator 43 compares, with a pre-set value, the number of the out-of-synchronism pulses or the rising edge of the out-of-synchronism pulses counted by the counter 51, and issues an alarm when the number is equal to or more than the pre-set value. At the time T2, the timer 52 resets the counter 51, and the counter 51 restarts the counting of the number of out-of-synchronism pulses or the rising edges of the out-of-synchronism pulses.

At the time T2, the counter 51 starts to count the number of out-of-synchronism pulses or the rising edges of the out-of-synchronism pulses, and at the time T3, outputs the result to the comparator 53. The number of out-of-synchronism pulses or the rising edges of the out-of-synchronism pulses counted by the counter 51 for the period between the time T2 and the time T3 becomes equal to or more than the set value of the comparator 53, then an alarm being issued.

Figure 8:
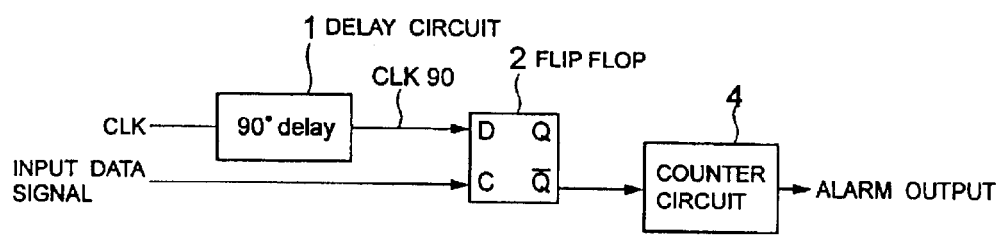
FIG. 8 is a circuit diagram for showing a configuration according to another embodiment of the present invention.

Here, for optical receiving devices used in optical communication systems of a WDM (Wave Length Division Multiplex) scheme or the like, various standards are defined to maintain the quality of transmission lines by ITU (International Telecommunication Union). In such optical communication systems, the maximum of the allowable number of continuing bits of the same symbol in data signals (continuation of a symbol "1" or "0") is determined to be 72 bits by the standard of ITU. When the number of continuing bits of the same symbol is large in this way, the use of a configuration shown in FIG. 8 is considered instead of the configuration shown in FIG. 1. That is, in the configuration of FIG. 8, the AND circuit 3 shown in FIG. 1 is eliminated and the inverted output of the flip flop 2 is directly input to the counter circuit 4. Thus, the counter circuit 4 is adapted to count the inverted output of the flip flop 2.

Figure 9:
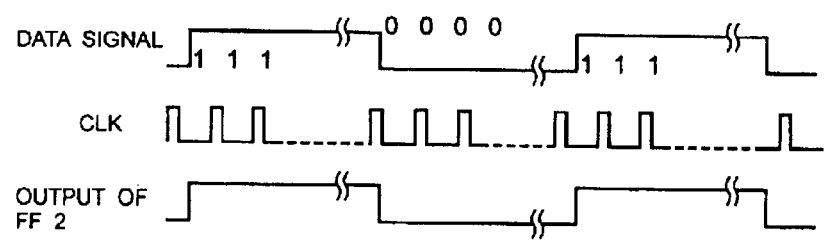
FIG. 9 is a waveform diagram for showing an operation of a circuit of FIG. 8.

FIG. 9 is a waveform diagram for showing an example of operation of the configuration of FIG. 8. A data signal may include a continuation of multiple bits of the same symbol, and then the counting period of the counter circuit 4 is set to be very larger than the maximum value (72 bits) of the allowable bit number. Therefore, it is apparent that the counter circuit 4 directly counts the inverted output of the flip flop 2 of FIG. 9 and the resultant count value is compared with the predetermined reference value, thereby permitting alarm-issuing.

The clock's out-of-synchronism state detection circuits according to each embodiment described above are advantageous when they are used for the optical receiving device described above, and they have the logic circuit configurations, permitting easy integration as IC (LSI) circuits. Thus, the detection circuits are suitable for integrating the optical receiving device into a LSI circuit.

As described above, according to the present invention, a clock signal in synchronization with a data signal is delayed by 90°, the delayed clock is read in at the points of change of the data signal (rising edges or trailing edges), pulses (out-of-synchronism pulses) obtained by the logic products of the read-in results and the data signal or the rising edges of the pulses are counted, and when the count value becomes equal to or more than a given value, an clock's out-of-synchronism state detection alarm is issued. Thus, the present invention has an advantage that an out-of-synchronism state of the clock can be detected reliably.

Also, because the clock delayed by 90° is read in at the points of change of the data signal (rising edges or trailing edges), when the width of jitter of the data signal is within the width of high level of the clock, no alarm is issued. That is, even if jitter is present in data, advantageously no malfunction occurs.

Further, since the counter is configured by logic circuits, the number of out-of-synchronism pulses giving a threshold value for issuing an alarm can be easily determined, and the counter is resistant to noise such as jitter in data. Also, counting time can be easily set, thus providing a high degree of flexibility in setting alarm-issuing time.

What is claimed is:

1. A clock's out-of-synchronism state detection circuit, comprising:
reading-in means for reading a clock signal in at the point of change of a data signal;
logic computing means for performing a logic computing of the read-in result obtained by said reading-in means and said data signal; and
counter means for counting said logic-computing output, wherein the out-of-synchronism state of said clock with respect to said data is detected based on the count result of said counter means.

2. The clock's out-of-synchronism state detection circuit according to claim 1, further comprising a delay device for delaying said clock signal by about 90°,
wherein said reading-in means is configured to read the delayed clock signal in.

3. The clock's out-of-synchronism state detection circuit according to claim 2, wherein said reading-in means is a flip flop receiving the delayed clock signal delayed by said delay device as a data input and said data signal as a clock input.

4. The clock's out-of-synchronism state detection circuit according to claim 3,
wherein said logic computing means is a logic product circuit for outputting the logic product of an inverted output of said flip flop and said data signal.

5. The clock's out-of-synchronism state detection circuit according to claim 1,
wherein said counter means is configured to count said logic-computing output every a given time, and to generate a detection signal for showing an out-of-synchronism state when the count value reaches to a predetermined value.

6. The clock's out-of-synchronism state detection circuit according to claim 1,
wherein said counter means comprises:
counter for counting input every a given time; and
comparing means for comparing the count value with said predetermined value,
wherein the comparison result is used as an out-of-synchronism state detection signal.

7. The clock's out-of-synchronism state detection circuit according to claim 6, further comprising means for resetting said counter every said given time.

8. The clock's out-of-synchronism state detection circuit according to claim 1, wherein said counter means comprises:
a counter which counts input every a given time and of which output level changes when the count value reaches to said predetermined value;
a first flip flop taking in a predetermined level at the timing of change of the output level of said counter and holding it for said given time; and
a second flip flop taking in the holding level of said first flip flop every said given time and holding it,
wherein the holding output of said second flip flop is used as an out-of-synchronism state detection signal.

9. The clock's out-of-synchronism state detection circuit according to claim 8, further comprising means for generating reset pulses for resetting said counter and said first flip flop every said given time.

10. The clock's out-of-synchronism state detection circuit according to claim 9,
wherein said reset pulse is further used as a timing pulse for taking in data in said second flip flop.

11. The clock's out-of-synchronism state detection circuit according to claim 10, further comprising delaying means for delaying said data-taking-in timing pulse by a predetermined time and outputting it as said reset pulse.

12. A clock's out-of-synchronism state detection circuit, comprising:
reading-in means for reading a clock signal in at the point of change of a data signal; and
counting means for counting the read-in result obtained by said reading-in means, wherein,
an out-of-synchronism state of said clock with respect to said data is detected based on the count result of said counter means,
said counting means comprises
a counter for counting input every a given time, and
a comparing means for comparing the count value with said predetermined value, and
the comparison result is used as an out-of-synchronism state detection signal.

13. The clock's out-of-synchronism state detection circuit according to claim 12, further comprising a delay device for delaying said clock signal by about 90°,
wherein said reading-in means is adapted to read the delayed clock signal in.

14. The clock's out-of-synchronism state detection circuit according to claim 13,
wherein said reading-in means is a flip flop receiving the delayed clock signal delayed by said delay device as a data input and said data signal as a clock input.

15. The clock's out-of-synchronism state detection circuit according to claim 12,
wherein said counter means is configured to count the output of said reading-in means the every given time, and to generate a detection signal for showing an out-of-synchronism state when the count value reaches to a predetermined value.

16. The clock's out-of-synchronism detection circuit according to claim 12, comprising connection to an optical receiving means.

* * * * *